(12) United States Patent
Veches et al.

(10) Patent No.: US 11,532,349 B2
(45) Date of Patent: Dec. 20, 2022

(54) POWER DISTRIBUTION FOR STACKED MEMORY

(71) Applicant: Micron Technology, Inc., Boise, ID (US)

(72) Inventors: Anthony D. Veches, Boise, ID (US); Brian P. Callaway, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/221,498

(22) Filed: Apr. 2, 2021

(65) Prior Publication Data

US 2022/0319569 A1 Oct. 6, 2022

(51) Int. Cl.
| | |
|---|---|
| *G11C 11/40* | (2006.01) |
| *G11C 11/4074* | (2006.01) |
| *H01L 25/065* | (2006.01) |
| *H01L 25/00* | (2006.01) |
| *H01L 23/00* | (2006.01) |

(Continued)

(52) U.S. Cl.
CPC ...... *G11C 11/4074* (2013.01); *G06F 13/1668* (2013.01); *G11C 11/2297* (2013.01); *H01L 23/5252* (2013.01); *H01L 23/5256* (2013.01); *H01L 24/08* (2013.01); *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06527* (2013.01); *H01L 2225/06544* (2013.01); *H01L 2225/06562* (2013.01); *H01L 2225/06582* (2013.01);

(Continued)

(58) Field of Classification Search
CPC ... G11C 11/4074; G11C 11/2297; G11C 5/14; H01L 23/5252; H01L 23/5256; H01L 24/08; H01L 24/80; H01L 25/0657; H01L 25/50; H01L 2224/08145; H01L 2224/80895; H01L 2224/80896; H01L 2225/06527; H01L 2225/06544; H01L 2225/06562; H01L 2225/06582; H01L 2924/1427; H01L 2924/1436; H01L 2924/1441; G06F 13/1668
See application file for complete search history.

(56) References Cited

U.S. PATENT DOCUMENTS

2017/0154655 A1* 6/2017 Seo .................. G11C 8/06
2019/0237390 A1* 8/2019 Rho ................ H01L 23/481
(Continued)

*Primary Examiner* — Tan T. Nguyen
(74) *Attorney, Agent, or Firm* — Holland & Hart LLP

(57) ABSTRACT

Methods, systems, and devices for power distribution for stacked memory are described. A memory die may be configured with one or more conductive paths for providing power to another memory die, where each conductive path may pass through the memory die but may be electrically isolated from circuitry for operating the memory die. Each conductive path may provide an electronic coupling between at least one of a first set of contacts of the memory die (e.g., couplable with a power source) and at least one of a second set of contacts of the memory die (e.g., couplable with another memory die). To support operations of the memory die, a contact of the first set may be coupled with circuitry for operating a memory array of the memory die, and to support operations of another memory die, another contact of the first set may be electrically isolated from the circuitry.

19 Claims, 6 Drawing Sheets

(51) Int. Cl.
*H01L 23/525* (2006.01)
*G11C 11/22* (2006.01)
*G06F 13/16* (2006.01)

(52) U.S. Cl.
CPC ................ *H01L 2924/1427* (2013.01); *H01L 2924/1436* (2013.01); *H01L 2924/1441* (2013.01)

(56) References Cited

U.S. PATENT DOCUMENTS

2020/0212020 A1* 7/2020 Zhang .................. H01L 23/528
2021/0066169 A1* 3/2021 Tsai ....................... H01L 23/49
2021/0217482 A1* 7/2021 Choi .................. G11C 11/4074

* cited by examiner

POWER DISTRIBUTION FOR STACKED MEMORY

FIELD OF TECHNOLOGY

The following relates generally to one or more systems for memory and more specifically to power distribution for stacked memory.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
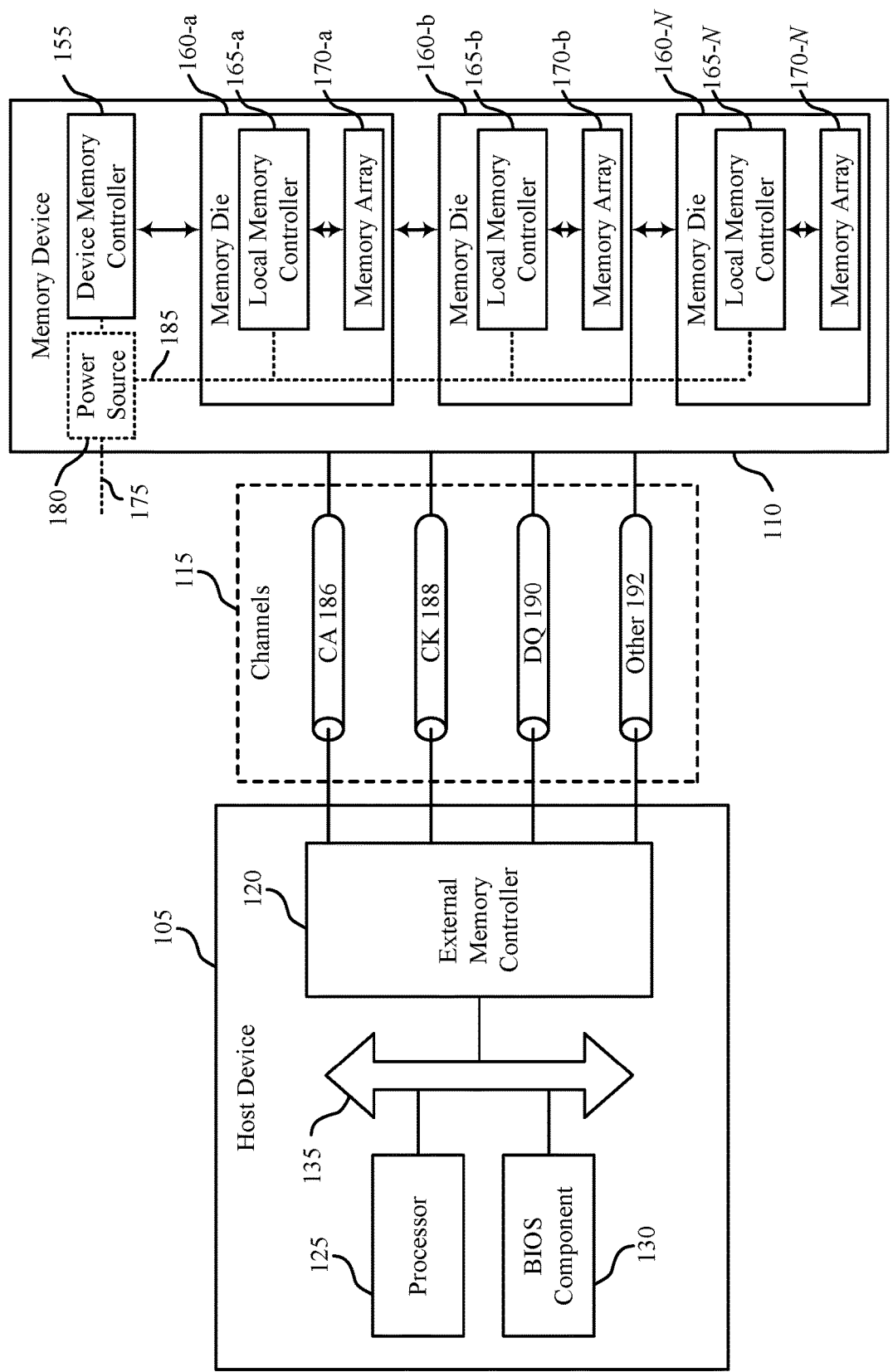
FIG. 1 illustrates an example of a system that supports power distribution for stacked memory in accordance with examples as disclosed herein.

A memory device may include one or more memory dies, where each memory die may refer to a semiconductor chip configured with a respective memory array and circuitry for operating at least the respective memory array (e.g., for supporting read operations, write operations, memory management operations). In some examples, a memory device may include multiple discrete memory dies that may be controlled or accessed by a host device via a common communicative link (e.g., via a common command and address channel or bus). A stacked memory device may refer to a memory device that includes multiple discrete memory dies that are coupled together (e.g., bonded, soldered, welded), where such coupling may include providing an electrical interconnection between one or more electrical contacts of different memory dies (e.g., adjacent memory dies, directly adjacent memory dies). In some examples, a stacked memory device may include a power source that is common to (e.g., shared by) two or more of the memory dies, and power may be provided to a first memory die (e.g., a memory die that is farther from the power source) via a conductor that passes through a second memory die (e.g., a memory die that is nearer to the power source). In some cases, when such a conductor is configured to provide power for both the first memory die and the second memory die, performance of one or both of the first memory die and the second memory die may be degraded.

In accordance with examples as disclosed herein, a memory die may be configured with one or more conductive paths for providing power to one or more other memory dies of a stacked memory device, where each conductive path may pass through the memory die, but may be electrically isolated or isolatable from circuitry for operating the memory die. Each conductive path may be referred to as or operate as a supply conductor, such as a dedicated through-die supply conductor, and may provide an electronic coupling between one of a first set of electrical contacts of the memory die (e.g., on a first surface of the memory die) and one of a second set of electrical contacts of the memory die (e.g., on a second surface of the memory die). Each of the first set of contacts may be configurable for coupling with a power source, such as a shared power source, and, within the memory die, each of the first set of contacts may be electrically isolated from one another and each of the second set of contacts may be electrically isolated from one another. To support operations of the memory die, one or more contacts of the first set of electrical contacts may be electrically coupled with circuitry for operating a memory array of the memory die (e.g., configuring one or more of the first set of electrical contacts of the memory die for providing power to the circuitry of the memory die). To support operations of another memory die, one or more other contacts of the first set of electrical contacts may be electrically isolated from the circuitry for operating the memory array of the memory die (e.g., configuring or dedicating one or more of the first set of electrical contacts or the memory die, and associated through-die supply conductors, for providing power to another memory die). By providing conductive paths through a memory die that are electrically isolated from operating circuitry of the memory die, power can be provided to another memory die with improved characteristics, such as improved voltage stability, improved temperature distribution, or reduced noise, which may improve memory device performance compared to configurations where a through-die supply conductor supports power source for multiple memory dies.

Features of the disclosure are initially described in the context of systems and dies as described with reference to FIGS. 1 and 2. These and other features of the disclosure are further illustrated by and described with reference to examples of memory dies, stacked memory devices, and fabrication techniques that relate to power distribution for stacked memory as described with reference to FIGS. 3A through 6.

FIG. 1 illustrates an example of a system 100 that supports power distribution for stacked memory in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186 (e.g., a CA bus, a command/address bus, a C/A bus), one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory device 110 may include a power source that is common to (e.g., shared by) multiple memory dies 160 of the memory device 110. For example, the memory device 110 may include a power source 180, which may be configured to provide power (e.g., convey power, supply power, via an output conductor 185) to each of the memory dies 160-*a* through 160-N. Although the output conductor 185 is illustrated as being coupled with a respective local memory controller 165 of each of the memory dies 160, a memory device 110 may include various configurations of an output conductor 185 for additionally or alternatively coupling a power source 180 with a set of memory arrays 170, or various components of a set of memory arrays 170.

The power source 180 may include various components or circuitry that support providing power to the memory dies 160 at a regulated voltage, or otherwise providing a regulated voltage to each of the memory dies 160 (e.g., as a voltage source). In some examples, the power source 180 itself may include or refer to voltage regulation circuitry (e.g., of the memory device 110) for providing power according to a regulated voltage, such as components or circuitry configured for establishing a voltage level at the output conductor 185, for filtering noise or other fluctuations of voltage from the input conductor 175 or on the output conductor 185, among other components or circuitry. Additionally or alternatively, the power source 180 may be configured to receive power at a regulated voltage (e.g., via an input conductor 175), and the power source 180 may or may not include additional voltage regulation circuitry. For example, the power source 180 may refer to a pass-through conductor of the memory device 110 (e.g., a node of the memory device 110) from which or through which power is provided to each of the memory dies 160.

In various examples, the input conductor 175 may include or be otherwise associated with a pin or contact of the memory device 110, which may or may not be coupled with or through the host device 105. Power may be supplied to the input conductor 175 by a power converter or voltage regulator (e.g., of the host device 105, of a device external to the host device 105), a battery, an electrical grid or distribution system, or other types of power sources or generators. Although a single output conductor 185 is illustrated in the memory device 110, a power source 180 may be associated with more than one output conductor 185, such as a pair of conductors that provide or convey power according to a regulated voltage and a ground voltage (e.g., a chassis ground conductor) or other reference voltage, or other quantities of conductors that may provide power according to one or more voltage levels.

In some examples, the output conductor 185 may include one or more portions that pass through a memory die 160 (e.g., through each of the memory die 160-a, the memory die 160-b, and the memory die 160-N, across a through-silicon via (TSV) or through-chip via of a memory die 160), such that power is distributed along a single, common path or bus. However, in some cases, such a configuration may be associated with degraded performance among the memory dies 160. For example, current flowing through the output conductor 185 to support power consumption of the memory dies 160 may be associated with a voltage drop along a length of the output conductor 185, such that memory dies 160 that are relatively farther from the power source 180 may be provided with a voltage that is different than (e.g., relatively lower than) a voltage provided to memory dies 160 that are relatively nearer to the power source 180. In some examples (e.g., when supporting power consumption for multiple memory dies 160), a current or current density through a portion of the output conductor 185 that is relatively near the power source 180 may be relatively high compared to portions of the output conductor that are relatively farther from the power source 180. In some cases, a relatively high current or current density may be associated with localized heating that increases resistance of the output conductor 185, causes localized thermal stress, strain, or fatigue, or causes thermally-induced material degradation or operational degradation of memory dies 160 (e.g., memory dies 160 that are relatively nearer to the power source 180), among other adverse behavior. Additionally or alternatively, various operations or switching events of one memory die 160 may induce noise, reflections, or other voltage fluctuations or instability along the output conductor 185, and such voltage fluctuations or instability may degrade performance of another memory die 160. Thus, according to these and other examples, a stacked memory device 110 configured with a common output conductor 185 that passes through a set of memory dies 160 and is shared among the set of memory dies 160 may be associated with certain performance limitations.

In accordance with examples as disclosed herein, a memory die 160 may be configured with one or more conductive paths for providing power to one or more other memory dies 160, where at least some of the conductive paths may pass through the memory die 160, but may be isolated from circuitry for operating the memory die 160 (e.g., electrically isolated from circuitry for operating a memory array 170). Each conductive path may be or may be referred to as a through-die supply conductor, a TSV, or a through-chip via, and may provide an electronic coupling between one of a first set of electrical contacts of the memory die 160 (e.g., on a first surface of the memory die 160) and one of a second set of electrical contacts of the memory die 160 (e.g., on a second surface of the memory die 160). Each of the first set of contacts may be configurable for coupling with a shared power source 180 and, within the memory die 160, each of the first set of contacts may be electrically isolated from one another and each of the second set of contacts may be electrically isolated from one another. By providing conductive paths through a memory die 160 that are electrically isolated from operating circuitry of the memory die 160, power may be provided to another memory die 160 with improved characteristics, such as improved voltage stability or reduced noise, favorably distributed current, current density, or thermal characteristics, or other beneficial characteristics that may improve performance of a memory device 110 compared to configurations where a through-die output conductor 185 supports power source for multiple memory dies 160.

Figure 2:
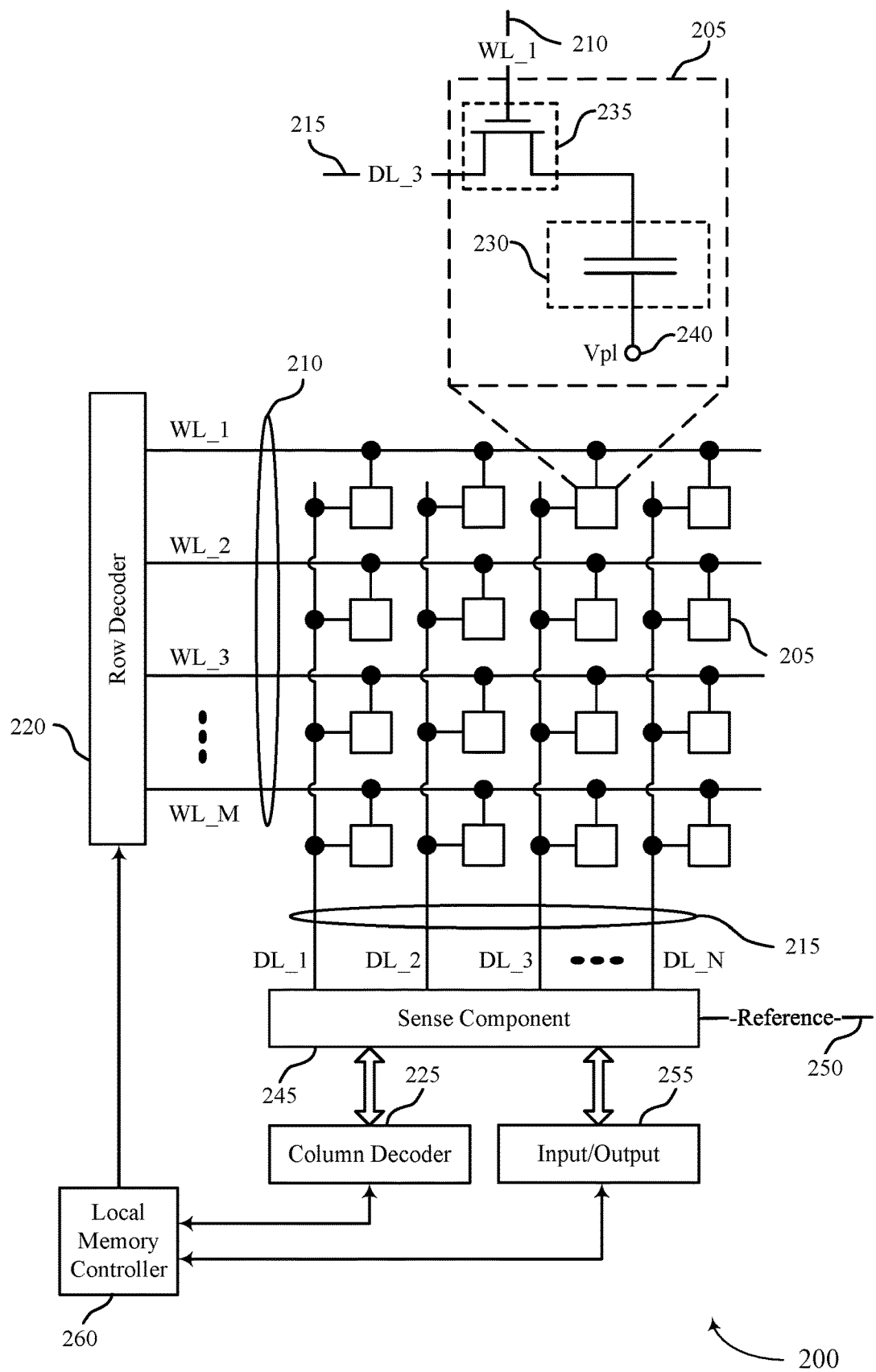
FIG. 2 illustrates an example of a memory die that supports power distribution for stacked memory in accordance with examples as disclosed herein.

FIG. 2 illustrates an example of a memory die 200 that supports power distribution for stacked memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Various components of the memory die 200 may be coupled with a power source 180 (e.g., of a memory device 110) that is external to the memory die 200 for supporting various operations of the memory die 200, such as read operations, write operations, refresh operations, memory management operations, and other operations of the memory die 200. For example, such a power source 180 may provide or convey power to store a logic state in a memory cell 205, to refresh or maintain a logic state stored at a memory cell 205, to identify a logic state stored in a memory cell 205, to perform memory management operations (e.g., at a local memory controller 260), or to communicate information between the memory die 200 and a device memory controller 155 or a host device 105, among other operations. To support such operations, a power source 180 may be directly or indirectly coupled with a local memory controller 260, a row decoder 220, a column decoder 225, a sense component 245, a reference 250, an input/output component 255, or various other components of a memory die 200 or combinations thereof.

In accordance with examples as disclosed herein, the memory die 200 may be configured with one or more conductive paths that support providing power to one or more other memory dies 200 included in a common memory device 110, where at least some of the conductive paths may pass through a package of the memory die 200 (e.g., passing through a chip containing the memory die 200), but may be electrically isolated from the circuitry for operating the memory die 200. By providing one or more conductive paths through a memory die 200 that are electrically isolated from operating circuitry of the memory die 200, power may be provided to one or more other memory dies 200 with improved characteristics, such as improved voltage stability or reduced noise, favorably distributed current, current density, or thermal characteristics, or other beneficial characteristics that may improve performance of a memory device 110, or memory dies 200 thereof, compared to other configurations.

Figure 3A:
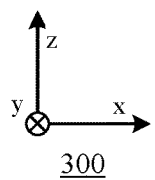
FIGS. 3A and 3B illustrate examples of a memory die and a stacked memory device that support power distribution for stacked memory in accordance with examples as disclosed herein.
Figure 3A:
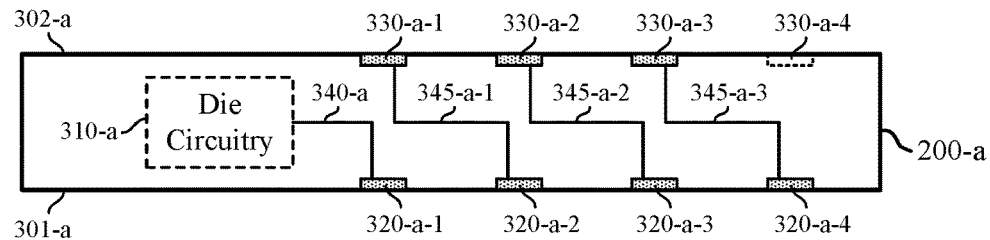
Figure 3B:
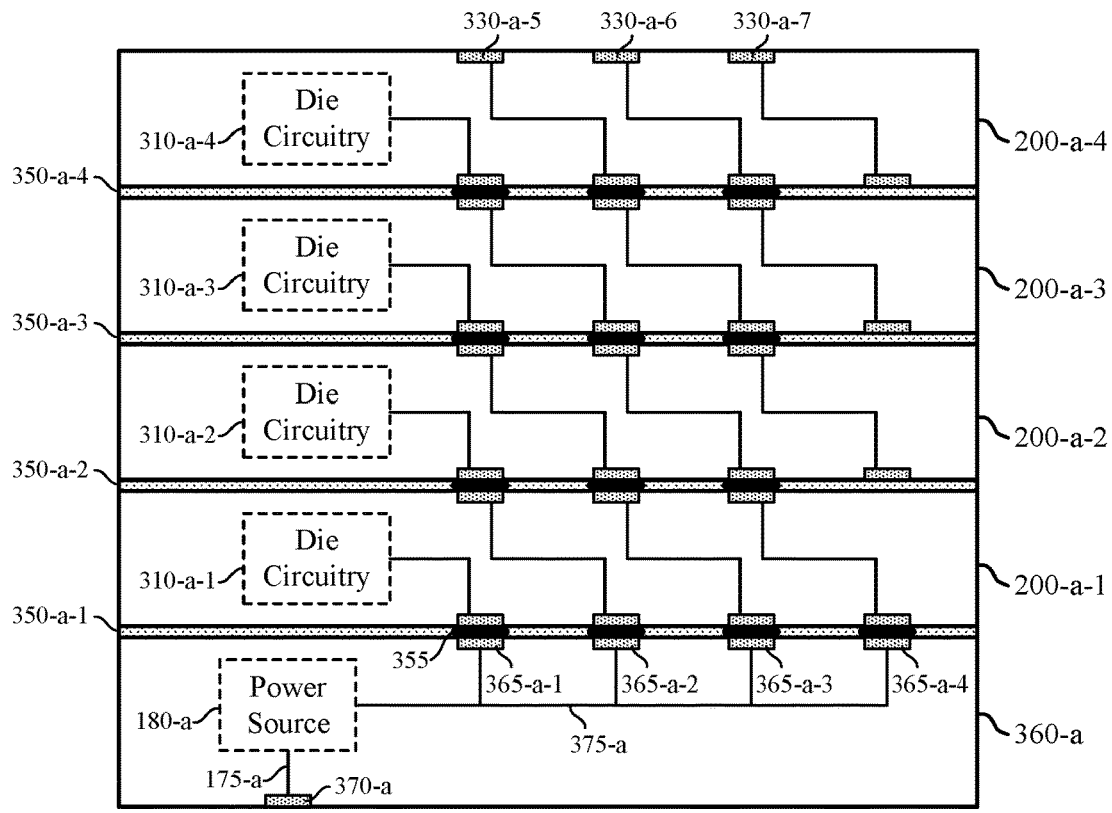

FIGS. 3A and 3B illustrate examples of a memory die 200-*a* and a memory device 110-*a*, respectively, that support power distribution for stacked memory in accordance with examples as disclosed herein. The memory die 200-*a* and the memory device 110-*a* may each be an example of aspects of the respective components as described with reference to FIGS. 1 and 2. For illustrative purposes, aspects of the memory die 200-*a* and the memory device 110-*a* may be described with reference to an x-direction, a y-direction, and a z-direction of a coordinate system 300. In some examples, the z-direction may be illustrative of a direction relative to a substrate of a memory die 200 (e.g., a height direction, a build-up direction), or a direction of die stacking for a stacked memory device 110 (e.g., a stack direction, a direction for stacking memory dies 200), or both.

The memory die 200-*a* may be an example of a semiconductor die that includes one or more memory arrays, such as one or more memory arrays 170 described with reference to FIG. 1. The memory die 200-*a* may be associated with (e.g., may have an exposed surface that includes, may have a physical boundary, volume, extent, or package that includes or is defined at least in part by) a first surface 301 (e.g., surface 301-*a*, a bottom surface, a bottom surface of a memory chip) and a second surface 302 (e.g., surface 302-*a*, a top surface, opposite the bottom surface along the z-direction, a top surface of a memory chip), each of which may be configured to be couplable with another component of a memory device 110 (e.g., in a stacked memory device 110).

The memory die 200-*a* may include die circuitry 310 (e.g., die circuitry 310-*a*), which may include various components or circuitry for operating the memory die 200-*a*. In some examples, die circuitry 310 may include the memory cells 205 of the one or more memory arrays of the memory die 200-*a*. In some examples, die circuitry 310 may include various components or circuitry for operating the one or more memory arrays (e.g., for supporting access operations on the memory cells 205 of the memory die 200-*a*), such as one or more of a local memory controller 260, a row decoder 220, a column decoder 225, a sense component 245, a reference 250, an input/output component 255, as described with reference to FIG. 2, or various other components or combinations of components.

The memory die 200-*a* may include a set of contacts 320 (e.g., contacts 320-*a*-1 through 320-*a*-4). In some examples, at least some of if not each of the contacts 320 may be coincident with the surface 301-*a*. The memory die 200-*a* may also include a set of contacts 330 (e.g., contacts 330-*a*-1 through 330-*a*-3). In some examples, at least some of if not each of the contacts 330 may be coincident with the surface 302-*a*. In some examples, contacts 320, contacts 330, or both may be included in or referred to as a ball grid array, a land grid array, or other configuration. Each of the contacts 320 and 330 may be physically couplable, electrically couplable, or both physically and electrically couplable with another component external to the memory die 200-*a*, and may include or be referred to as a bonding pad, a contact pad, a soldering pad, a wire bonding pad, a wedge bonding pad, or an electrical contact, among other constructs or terminology. In some examples, contacts 320 may each be configured to be couplable with a power source 180 (e.g., for coupling with a contact of a component that includes the power source 180, for coupling with a contact 330 of another memory die 200-*a* that includes a conductive path that is coupled or couplable with the power source 180). In some examples, contacts 330 may be configured to be couplable with another memory die 200 (e.g., contacts 320 of another memory die 200-*a*).

Within a memory die 200, each of the contacts 320 may be electrically isolated from one another, and each of the contacts 330 may be electrically isolated from one another. Accordingly, each of the contacts 320-*a*-2, 320-*a*-3, and 320-*a*-4 may be an example of an interface (e.g., an electrical interface, a conductive interface, a physical interface) that is isolated from the contact 320-*a*-1 (e.g., electrically isolated, within the memory die 200-*a*), and also electrically couplable with a power source (e.g., a same power source couplable with the contact 320-*a*-1). Moreover, each of the contacts 330-*a*-1, 330-*a*-2, and 330-*a*-3 may be an example of an interface that is isolated from the contact 320-*a*-1 (e.g., electrically isolated, within the memory die 200-*a*), that is coupled with a respective one of the other contacts 320-*a* (e.g., electrically coupled with one of contact 320-*a*-2, 320-*a*-3, or 320-*a*-4), and that is couplable with another semiconductor die 200-*a* (e.g., electrically couplable with a contact 320-*a* of another semiconductor die 200-*a*).

In some examples, the memory die 200-*a* may include a non-coupled contact (e.g., a dummy contact, an electrically isolated contact, an electrically inoperative contact), such as contact 330-*a*-4, which may not be electrically coupled with any other components of the memory die 200-*a*, but which may provide another area of the surface 302-*a* for bonding (e.g., soldering) with another memory die 200-*a* (e.g., with a contact 320 of the other memory die 200-*a*), which may improve bonding strength or uniformity between memory dies 200-*a*, or may improve heat dissipation between memory dies 200-*a*, among other benefits. Although not illustrated in the example of memory die 200-*a*, a memory die 200 may include other contacts related to conveying signals to or from the memory die 200 (e.g., to or from the die circuitry 310), such as signals associated with (e.g., for conveying, for communicating) communication between the die circuitry 310 and a host device 105 over channels 115, or communication between the die circuitry 310 and a device memory controller 155 of a stacked memory device 110, or communication between the die circuitry 310 and die circuitry 310 of another memory die 200, among other signals.

The memory die 200-*a* may include various conductive connections with the contacts 320-*a* and the contacts 330-*a*. For example, the contact 320-*a*-1 may be coupled with the die circuitry 310-*a* (e.g., electrically coupled, directly coupled or connected) via a conductor 340-*a*, and accordingly the contact 320-*a*-1 and the conductor 340-*a* may be operable to convey power for operating the die circuitry 310-*a*. Each of the other contacts 320-*a* may be electrically coupled with a respective one of the contacts 330-*a* via a respective conductor 345-*a* (e.g., the contact 320-*a*-2 coupled with the contact 330-*a*-1 via the conductor 345-*a*-1, and so on). Thus, each of the conductors 345-*a*, and their associated contact 320-*a* and contact 330-*a*, may be referred to as a through-die supply conductor or TSV of the memory die 200-*a* that is isolated from circuitry for operating the memory die 200-*a* (e.g., electrically isolated from the die circuitry 310-*a*, not countable with the die circuitry 310-*a*). Each of the through-die conductors 345-*a* may be operable to provide power from a power source of a memory device 110 to another memory die 200-*a* of the memory device 110 for supporting access operations on the memory cells of the other memory die 200-*a*.

In the example of memory die 200-*a*, each of the contacts 330-*a* may be associated with a position on the surface 302-*a* (e.g., having a location as defined in the x-direction, in the y-direction, or both the x-direction and the y-direction) that is the same as, or similar to (e.g., at least partially overlapping with), a position on the surface 301-*a* of a respective contact 320-*a* that is electrically isolated from the contact 330-*a*. For example, when viewed along the z-direction (e.g., a direction between the surface 301-*a* and the surface 302-*a*), a cross section (e.g., in the x-direction and y-direction) of each of the contacts 330-*a* may at least partially overlap with, or be otherwise coincident with, a cross section of a respective one of the contacts 320-*a* that is not coupled or connected with the respective contact 330-*a* by a conductor 345-*a*. Moreover, when viewed along the z-direction, a cross section of each of the contacts 330-*a* may not overlap with, or may be otherwise non-coincident with, the cross section of the respective one of the contacts 320-*a* that is coupled or connected with the respective contact 330-*a* by a conductor 345-*a*. Such an arrangement may be referred to as a diagonal through-die connection (e.g., a through die-connection that extends through the memory die 200-*a* along the z-direction and one or both of the x-direction or the y-direction), which may facilitate certain techniques for coupling stacked memory dies 200-*a* (e.g., as illustrated in the memory device 110-*a*).

The conductors 345-*a* may be formed according to various techniques that support a conceptually diagonal through-die arrangement. For example, conductors 345-*a* may be formed with various combinations of one or more portions extending perpendicular to the surface 301-*a* or the surface 302-*a* (e.g., extending along the z-direction, in a height direction relative to a substrate, such as one or more TSV segments of the memory die 200-*a*), and one or more portions extending parallel to the surface 301-*a* or the surface 302-*a* (e.g., extending in a direction perpendicular to the z-direction or in an xy-plane, such as a portion of an internal distribution or redistribution layer of the memory die 200-*a*). Additionally or alternatively, in some examples, the through-die conductors 345 may include one or more diagonal portions (e.g., conductive material portions that extend along the z-direction and one or more of the x-direction or the y-direction, conductive material portions that are not parallel with the z-direction or parallel with an xy-plane).

FIG. 3B illustrates an example of a memory device 110-*a* that includes a plurality of memory dies 200-*a* (e.g., memory dies 200-*a*-1 through 200-*a*-4, a stack of memory dies 200) as described with reference to FIG. 3A. The memory dies 200-*a*-1 through 200-*a*-4 may be stacked upon (e.g., stacked above) a base 360 (e.g., base 360-*a*), which may be an example of a semiconductor die, a printed circuit board (PCB), or other substrate component of the memory device 110-*a* for constructing or supporting a stacked memory assembly. In some examples, a base 360 may be referred to as a logic die of a memory device 110, and may refer to a semiconductor die that is separate from one or more memory dies 200 of a memory device 110.

In various examples of a stacked memory device 110, such as the memory device 110-*a*, one or more memory dies 200 and a base 360 may be assembled together (e.g., bonded, connected) using various techniques, such as soldering (e.g., using a reflow oven, using an infrared heater), bonding (e.g., thermosonic bonding, thermocompression bonding, wire bonding, wedge bonding), brazing, welding (e.g., ultrasonic welding, pressure welding), or other joining techniques. The example of memory device 110-*a* may include one or more bonding layers 350 (e.g., bonding layers 350-*a*-1 through 350-*a*-4) between respective assembled components as illustrated, where the bonding layers 350 may include conductive material portions 355, in contact with various contacts of the assembled components, for providing a respective electrical coupling or interconnection. In various examples, the conductive material portions 355 may include solder (e.g., solder balls), brazing, conductive paste, conductive wires, spring connectors, or other features or materials that provide an electrical interconnection between assembled components of the memory device 110-*a*.

A base 360 may include a power source 180 that is external to memory dies 200, such as the power source 180-*a* included in the base 360-*a*. The power source 180-*a* may be an example of one or more aspects of a power source 180 described with reference to FIGS. 1 and 2 and, in some examples, may include or be referred to as a voltage source or voltage regulator. The power source 180-*a* may receive power over an input conductor 175-*a* via a contact 370 (e.g., contact 370-*a*) of the base 360-*a*, which may be couplable with a host device 105 (e.g., a power supply or power supply pin of the host device 105) or another power supply. In the example of memory die 200-*a*, the power source 180-*a* may be configured for providing power to each of the memory dies 200-*a*-1 through 200-*a*-4. In some examples, a base 360 may include other components of a memory device 110 that are not illustrated, such as a device memory controller 155, which may be in communication with one or more of (e.g., all of) the memory dies 200 of the associated memory device 110, and may be operable for communication or other coupling or interconnection with a host device 105 (e.g., via channels 115 and associated contacts or pins of the base 360). In some examples, two or more of (e.g., all of) the memory dies 200 of a memory device 110 (e.g., one or more memory arrays 170 of each of the memory dies 200, memory cells 205 of each of the memory dies 200) may be addressable via a same or common communicative connection of the memory device 110 (not shown), such as a common command/address bus of the memory device 110 or between the memory device 110 and a host device 105.

In the example of memory device 110-*a*, the base 360-*a* includes a respective contact 365-*a*, each coupled with the power source 180-*a* via a conductor 375 (e.g., conductor 375-*a*), for providing power to each of the memory dies 200-*a*. For example, the contact 365-*a*-1 may be operable for providing power to the die circuitry 310-*a*-1 of the memory die 200-*a*-1, the contact 365-*a*-2 may be operable for providing power to the die circuitry 310-*a*-2 of the memory die 200-*a*-2, and so on. Thus, in the example of memory device 110-*a*, each of the memory dies 200-*a*-1 through 200-*a*-4 may be associated with a power distribution path that is isolated or dedicated between the base 360-*a* and the respective memory die 200-*a*, which may or may not include a dedicated through-die conductor (e.g., conductor 345) of one or more other memory dies 200-*a*. The example of memory device 110-*a* illustrates a stacked memory device with a stack of four memory dies 200-*a*, but the described techniques may be applied to any quantity of memory dies 200-*a* (e.g., including fewer or more memory dies, which may include various configurations of stacking or combinations of stacked elements). For example, to support a stacked memory device 110 with n memory dies 200-*a*, each memory die 200-*a* may be configured with n contacts 320-*a*, at least n−1 contacts 330-*a*, and at least n−1 conductors 345-*a*.

In the example of memory device 110-*a*, which illustrates a diagonal through-die arrangement, each of the memory dies 200-*a* may be identical (e.g., may be constructed identically), and may be assembled in an aligned manner (e.g., with respective edges being aligned or flush in the x-direction, in the y-direction, or both). Such a configuration may be implemented to reduce a quantity of unique parts (e.g., unique memory dies 200, respective memory dies 200 having contacts 320 or contacts 330 in unique locations), or to facilitate component alignment during assembly with efficient use of die material (e.g., avoiding spacing portions of a memory die 200 in the x-direction or y-direction), among other benefits.

Although the memory device 110-*a* is illustrated as having faces of the memory dies 200-*a* and the base 360-*a* being exposed, in some examples, one or more of the faces of a memory device 110 may be covered or coated by a secondary material, such as a dielectric material or a plastic coating, to protect internal components of the memory device 110. In the example of memory device 110-*a*, such a material may at least partially if not fully cover the contacts 330-*a*-5, 330-*a*-6, and 330-*a*-7 of the memory die 200-*a*-4, but may not cover the contact 370-*a*. In some cases, it may be beneficial to avoid certain electrically floating structures in a memory die 200, in which case one or more of the contacts 330-*a*-5, 330-*a*-6, or 330-*a*-7 may be electrically grounded or coupled with another voltage source (e.g., a ground voltage source, a reference voltage source) without interfering with the supply of power to the respective die circuitry 310-*a* of each memory die 200-*a*. In some examples, such techniques may include providing a metallization or other conductive material portion on one or more outside surfaces of memory dies 200 or a base 360 (e.g., at least a portion of a top surface of the memory die 200-*a*-4, one or more side surfaces of one or more of memory dies 200-*a*-1 through 200-*a*-4 or base 360-*a*), which may additionally provide a degree of electromagnetic shielding for at least a portion of the memory dies 200 or the base 360.

Although described and illustrated with reference to interconnection with one power source 180 for a single voltage level, a memory die 200 or memory device 110 may include various arrangements for interconnection with a power source 180 supporting multiple conductive paths of a memory die 200-*a* for a same voltage level, interconnection with one or more power sources 180 supporting multiple voltage levels, or various combinations thereof. In some examples, the conceptual arrangement of contacts 320-*a*, contacts 330-*a*, conductors 340-*a*, and conductors 345-*a* (e.g., a diagonal through-die arrangement), as applied to one voltage level in FIG. 3B, may be functionally repeated for one or more other voltage levels (not illustrated). For example, such a conceptual layout may be functionally repeated to support one or more of a drain power voltage (e.g., VDD), a source power voltage (e.g., VSS, a ground voltage), a positive pump voltage (e.g., VPP), a reference voltage (e.g., VREF), a substrate power voltage (e.g., VBB, a negative voltage), or various other voltages or combinations thereof, which may be provided by a single power source 180 (e.g., a single voltage source, a single voltage regulator) or some combination of power sources 180 (e.g., multiple voltage sources, multiple voltage regulators). Additionally or alternatively, the conceptual arrangement of contacts 320-*a*, contacts 330-*a*, conductors 340-*a*, and conductors 345-*a* (e.g., a diagonal through-die arrangement), as applied to a single connection with a single die circuitry 310 in FIG. 3B, may be functionally repeated for multiple connections with a single die circuitry 310 of a memory die 200, functionally repeated for connections with multiple die circuitry 310 of a memory die 200, or various combinations thereof (not illustrated). In these and other examples, respective contacts and conductors of functionally repeated layouts may be distributed across different portions of a memory die 200 to maintain electrical isolation between the functionally repeated layouts, such as having contacts and conductors distributed across different positions in the x-direction, different positions in the y-direction, or both.

Figure 4A:
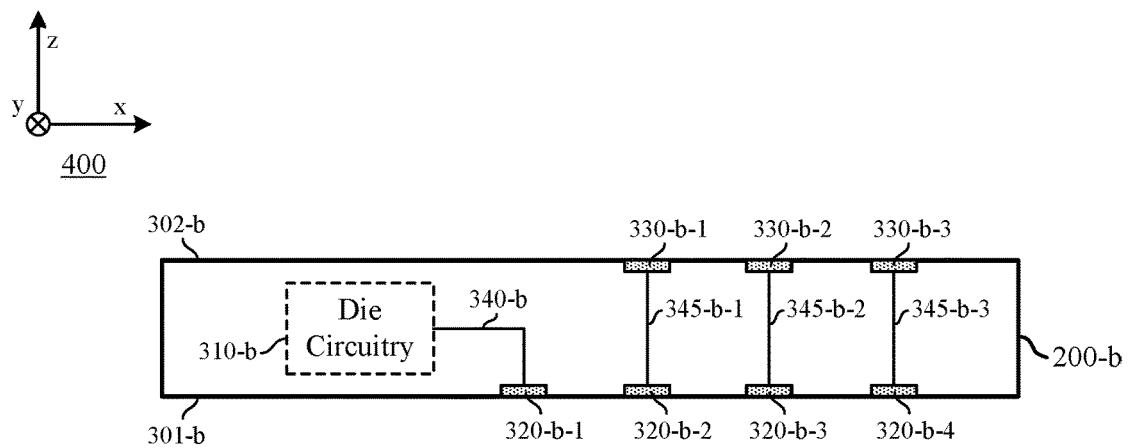
FIGS. 4A and 4B illustrate examples of a memory die and a stacked memory device that support power distribution for stacked memory in accordance with examples as disclosed herein.
Figure 4B:
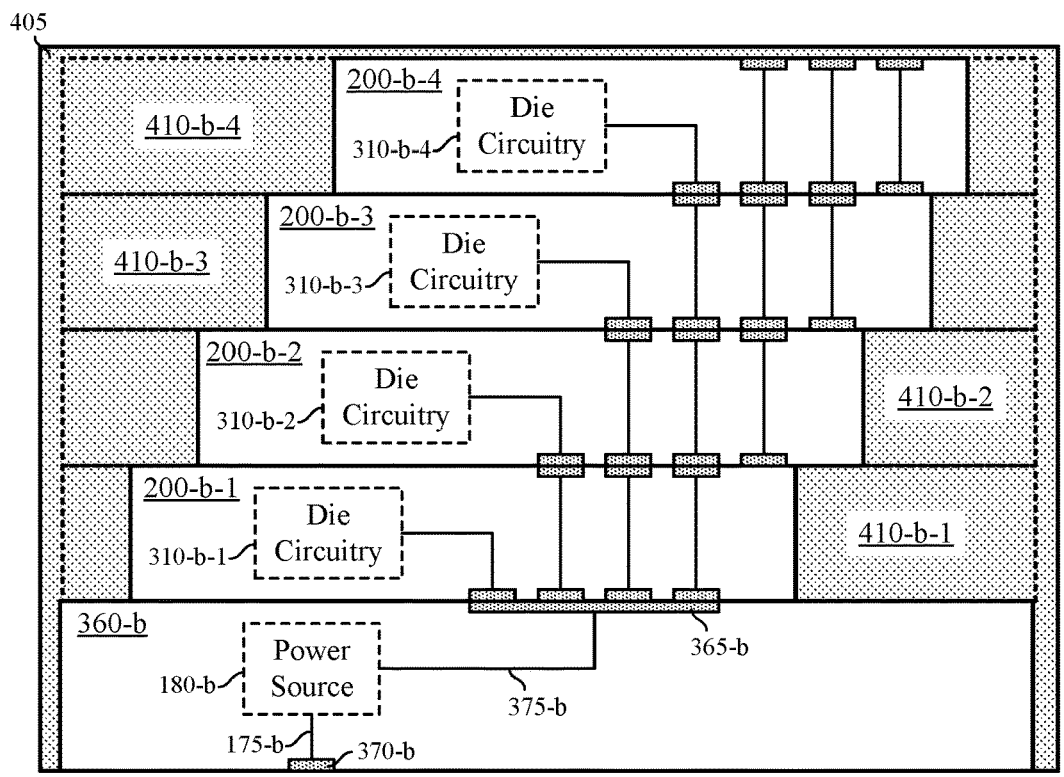

FIGS. 4A and 4B illustrate examples of a memory die 200-*b* and a memory device 110-*b*, respectively, that support power distribution for stacked memory in accordance with examples as disclosed herein. The memory die 200-*b* and the memory device 110-*b* may each be an example of aspects of the respective components as described with reference to FIGS. 1 and 2. For illustrative purposes, aspects of the memory die 200-*b* and the memory device 110-*b* may be described with reference to an x-direction, a y-direction, and a z-direction of a coordinate system 400.

The memory die 200-*b* may be associated with a first surface 301 (e.g., surface 301-*b*) and a second surface 302 (e.g., surface 302-*b*), and may include die circuitry 310-*b*, each of which may be an example of the respective features described with reference to FIGS. 3A and 3B. The memory die 200-*b* may also include a set of contacts 320 (e.g., contacts 320-*b*-1 through 320-*b*-4), at least some of which if not each of which may be coincident with the surface 301-*b*, and a set of contacts 330 (e.g., contacts 330-*b*-1 through 330-*b*-3), at least some of which if not each of which may be coincident with the surface 302-*b*. The contact 320-*b*-1 may be coupled with the die circuitry 310-*b* via a conductor 340-*b*, and at least some if not each of the other contacts 320-*b* may be electrically coupled with a respective one of the contacts 330-*b* via a respective conductor 345-*b*.

In the example of memory die 200-*b*, at least some of if not each of the contacts 330-*b* may be associated with a position on the surface 302-*b* (e.g., in the x-direction and y-direction) that is the same as, or similar to (e.g., at least partially overlapping with), a position on the surface 301-*b* of a respective contact 320-*b* that is coupled with the contact 330-*b*. For example, when viewed along the z-direction, a cross section (e.g., in the x-direction and y-direction) of each of the contacts 330-*b* may at least partially overlap with, or be otherwise coincident with, a cross section of a respective one of the contacts 320-*b* that is connected with the respective contact 330-*b* by a conductor 345-*b*. Moreover, when viewed along the z-direction, a cross section of each of the contacts 330-*b* may not overlap with, or may be otherwise non-coincident with, the cross section of the respective one of the contacts 320-*b* that is not connected with the respective contact 330-*b* by a conductor 345-*b*. Such an arrangement may be referred to as a straight through-die connection (e.g., a through die-connection that extends through the memory die 200-*b* directly or predominantly along the z-direction), which may facilitate certain techniques for manufacturing memory dies 200-*b* for a stacked memory device (e.g., as illustrated in the memory device 110-*b*). For example, conductors 345-*b* may be formed without one or more portions directed along the x-direction or y-direction, and may be formed by a single TSV formation operation, or by a combination of stacked, co-located TSV formation operations.

FIG. 4B illustrates an example of a memory device 110-*b* that includes a plurality of memory dies 200-*b* (e.g., memory dies 200-*b*-1 through 200-*b*-4) as described with reference to FIG. 4A. The memory dies 200-*b*-1 through 200-*b*-4 may be stacked upon (e.g., stacked above) a base 360-*b*, which may be an example of aspects of a base 360 as described with reference to FIG. 3B. The base 360-*b* may include a power source 180-*b*, which may receive power over an input conductor 175-*b* via a contact 370-*b*. In the example of memory device 110-*b*, the base 360-*b* includes a single contact 365-*b* coupled with the power source 180-*b* via a conductor 375-*b*. The contact 365-*b* may be couplable to each of the contacts 320-*b* of the memory die 200-*b*-1 (e.g., a first memory die 200-*b* in a stack), and may be operable for providing power to each of the memory dies 200-*b* of the memory device 110-*b*. In the example of memory device 110-*b*, contacts of the memory dies 200-*b* and contacts of the base 360-*b* may be directly coupled or connected (e.g., without a bonding layer 350), which may be supported by such bonding techniques as thermosonic bonding, thermocompression bonding, ultrasonic welding, pressure welding, or other direct bonding techniques.

In the example of memory device 110-*b*, which illustrates a straight through-die arrangement, each of the memory dies 200-*b* may or may not be identical (e.g., may or may not be constructed identically). For example, to support identical memory dies 200-*b*, each of the memory dies 200-*b* may be physically staggered relative to one another (e.g., in the x-direction as illustrated, in the y-direction, in both the x-direction and y-direction) depending on the relative position of the memory die 200-*b* in the stack. For a memory device 110-*b* having different memory dies 200-*b* in each position of a stack, the memory dies 200-*b* may have a respective padding portion 410-*b*, depending on the position of the memory die 200-*b* in the stack, to support aligning edges of adjacent memory dies 200-*b* (e.g., in the x-direction, in the y-direction). In various examples, a padding portion 410 may be formed from a same material as the memory die 200-*b* (e.g., a semiconductor substrate with or without additional material formed on the substrate) or a different material (e.g., a dielectric material added to the edge of a memory die 200-*b* and planarized with the surfaces 301-*b* and 302-*b*). In other examples that may support aligning edges of interfacing memory dies 200-*b* with straight through-die conductors, each memory die 200-*b* may have contacts 320-*b* and 330-*b* having a respective position (e.g., in the x-direction, in the y-direction, on the surfaces 301-*b* and 302-*b*) that is based on a relative location of the memory die 200-*b* in a stack of memory dies 200-*b* (according to an internal staggering of respective memory dies 200-*b*). According to these and other techniques, a memory device 110-*b* may or may not include a covering 405 (e.g., a dielectric covering) to protect internal components of the memory device 110, which may or may not cover contacts 330-*b* of a top memory die 200-*b*, but which may not cover the contact 370-*b*.

Although described and illustrated with reference to interconnection with one power source 180 for a single voltage level, and for a single conductor 340-*b* and a single die circuitry 310-*b* for each memory die 200-*b*, the conceptual arrangement of contacts 320-*b*, contacts 330-*b*, conductors 340-*b*, and conductors 345-*b* (e.g., a straight through-die arrangement), as applied in FIG. 4B, may be functionally repeated for one or more other voltage levels, for multiple connections with a single die circuitry 310 of a memory die 200, for connections with multiple die circuitry 310 of a memory die 200, or various combinations thereof (not illustrated). Moreover, in some examples of a memory device 110 or memory die 200, one or more described techniques for straight through-die arrangements may be used in combination with one or more described techniques for diagonal through-die arrangements.

Figure 5A:
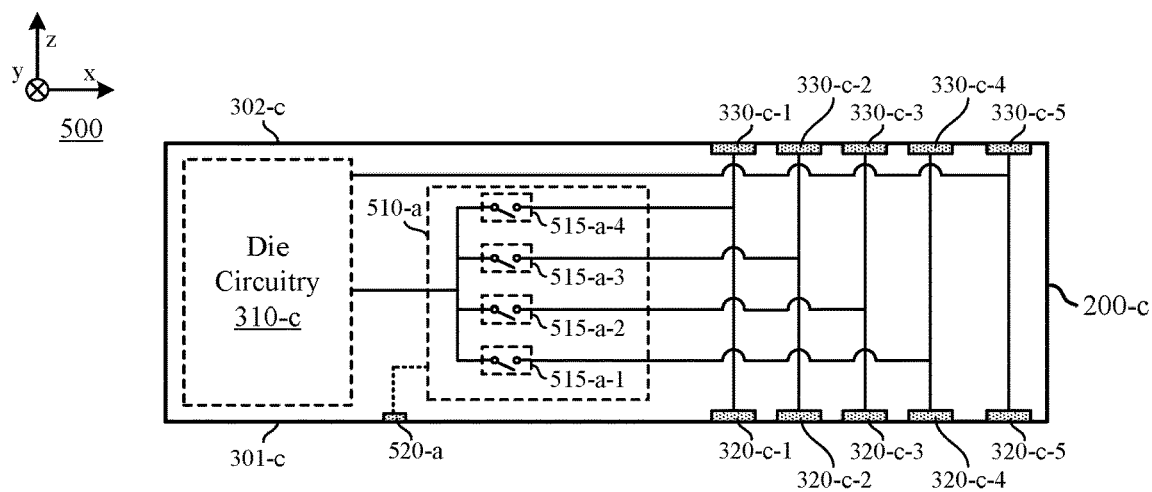
FIGS. 5A and 5B illustrate examples of a memory die and a stacked memory device that support power distribution for stacked memory in accordance with examples as disclosed herein.
Figure 5B:
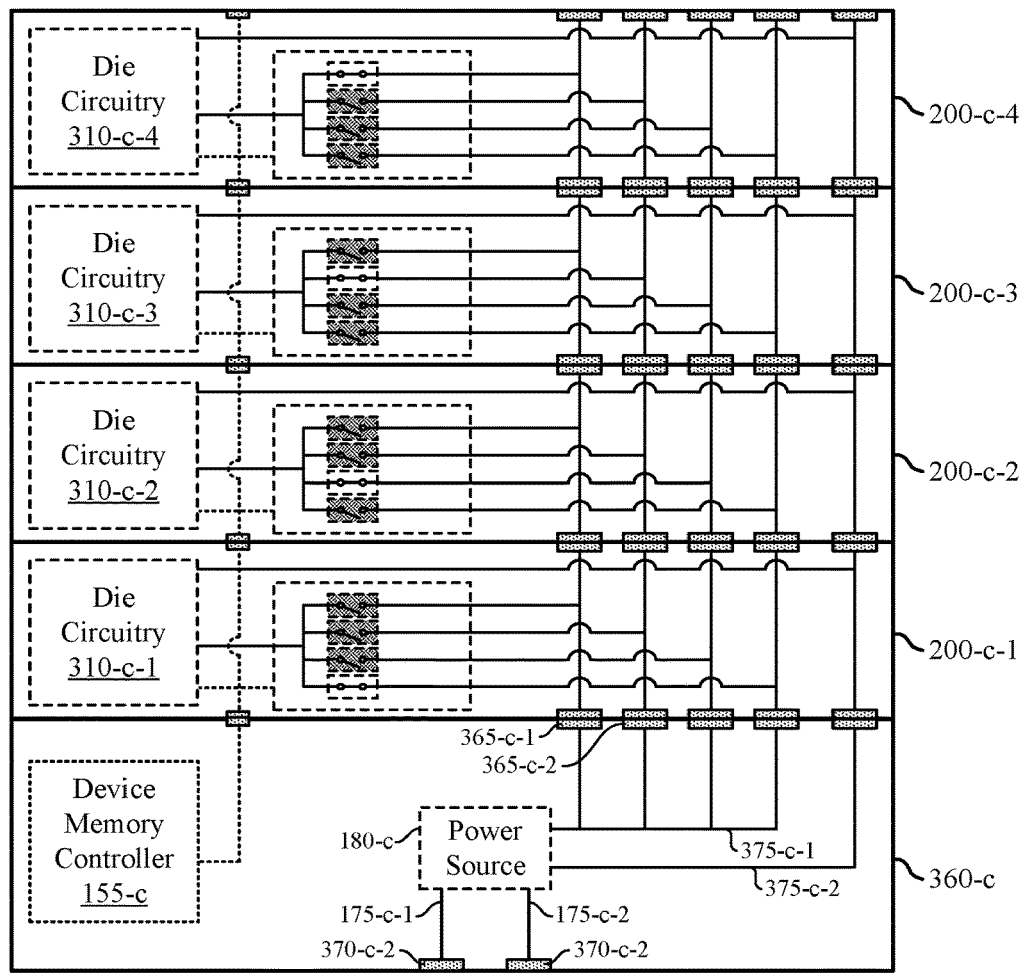

FIGS. 5A and 5B illustrate examples of a memory die 200-*c* and a memory device 110-*c*, respectively, that support power distribution for stacked memory in accordance with examples as disclosed herein. The memory die 200-*c* and the memory device 110-*c* may each be an example of aspects of the respective components as described with reference to FIGS. 1 and 2. For illustrative purposes, aspects of the memory die 200-*c* and the memory device 110-*c* may be described with reference to an x-direction, a y-direction, and a z-direction of a coordinate system 500.

The memory die 200-*c* may be associated with a first surface 301 (e.g., surface 301-*c*) and a second surface 302 (e.g., surface 302-*c*), and may include die circuitry 310-*c*, each of which may be an example of the respective features described with reference to FIGS. 3A through 4B. The memory die 200-*c* may also include a set of contacts 320 (e.g., contacts 320-*c*-1 through 320-*c*-5), at least some of which if not each of which may be coincident with the surface 301-*c*, and a set of contacts 330 (e.g., contacts 330-*c*-1 through 330-*c*-3), at least some of which if not each of which may be coincident with the surface 302-*c*. In the example of memory die 200-*c*, each of the contacts 330-*c* may be coupled (e.g., electrically coupled, directly connected) with a respective one of the contacts 320-*c* (e.g., by or as part of a straight or diagonal through-die conductor).

In the example of memory die 200-*c*, each of the contacts 320-*c*-1 through 320-*c*-4, and each of the contacts 330-*c*-1 through 330-*c*-4, may be coupled with a selection component 510 (e.g., selection component 510-*a*). The selection component 510-*a* may be operable to couple one or more of the contacts 320-*c* with the die circuitry 310-*c* (e.g., for operating the memory die 200-*c* using an external power source or voltage source at a first voltage level), to isolate one or more of the contacts 320-*c* from the die circuitry 310-*c* (e.g., to configure or dedicate a contact 320 for powering another memory die 200-*c*), or both. Additionally or alternatively, the selection component 510-*a* may be operable to couple one or more of the contacts 330-*c* with the die circuitry 310-*c*, to isolate one or more of the contacts 330-*c* from the die circuitry 310-*c* (e.g., to prevent or mitigate noise from operating the die circuitry 310-*c* from reaching the contacts 330-*c* or another memory die 200-*c*), or both. Thus, according to these and other examples, a selection component 510 of a memory die 200 may be operable to select or configure one or more conductive paths for providing power or voltage to die circuitry 310 of the memory die 200, and also to select or configure one or more other conductive paths to be isolated from the die circuitry 310 for providing power or voltage to another memory die 200.

A selection component 510 may be configured with various components or arrangements of components to support the described functionality. For example, the selection component 510-*a* illustrates an example where each of the contacts 320-*c*-1 through 320-*c*-4, and each of the contacts 330-*c*-1 through 330-*c*-4, are associated with a respective one of a set of switching components 515 (e.g., switching component 515-*a*-1 associated with contacts 320-*c*-4 and 330-*c*-4, and so on). In some examples, each of the switching components 515 of a selection component 510 may be a fuse, which may be a one-time programmable switch that is initially in a conductive or closed-circuit configuration, but can be programmed or set with a nonconductive, isolating, or open-circuit configuration (e.g., by breaking electrical continuity of the fuse). In some examples, each of the switching components 515 of a selection component 510 may be an anti-fuse, which may be a one-time programmable switch that is initially in a nonconductive, isolating, or open-circuit configuration, but can be programmed or set with a conductive or closed-circuit configuration (e.g., by establishing electrical continuity of the anti-fuse). In some examples, each of the switching components 515 of a selection component 510 may be a dynamic or continuously operable or programmable switch, such as a transistor, which may be controlled (e.g., using a logical signal) to be in either a closed-circuit or open-circuit configuration. The state of a switching component 515 may be programmed or otherwise controlled using signaling via one or more contacts 520 coupled with the selection component 510 (e.g., contact 520-a coupled with the selection component 510-a, an input conductor, an input bus), where such programming or configuration may be performed in a manufacturing or assembly operation (e.g., to set a state of a fuse or antifuse), performed during operation (e.g., for setting a state of one or more continuously programmable switching components 515, such as during a power-on or initialization), or various combinations thereof.

The memory die 200-c also illustrates an example of a shared through-die conductive path (e.g., for coupling with an external power source or voltage source at a second voltage level, such as a ground voltage). For example, the contact 320-c-5 may be coupled with the contact 330-c-5 using a through-die conductor that is also coupled (e.g., directly) with the die circuitry 310-c. Using such an arrangement, the contact 320-c-5 may be operable to provide power or a voltage to the die circuitry 310-c and the contact 330-c-5, and the contact 330-c-5 may be operable to provide power or the voltage to another memory die 200-c.

FIG. 5B illustrates an example of a memory device 110-c that includes a plurality of memory dies 200-c (e.g., memory dies 200-c-1 through 200-c-4) as described with reference to FIG. 5A. The memory dies 200-c-1 through 200-c-4 may be stacked upon (e.g., stacked above) a base 360-c, which may be an example of aspects of a base 360 as described with reference to FIG. 3B or 4B. The base 360-c may include a power source 180-c, which may receive power over input conductors 175-c-1 and 175-c-2, via contacts 370-c-1 and 370-c-2, respectively. The power source 180-c illustrates an example of power source 180 may provide power according to a first voltage level (e.g., over conductor 375-c-1) and a second voltage level (e.g., over conductor 375-c-2), such as a positive voltage and a ground voltage, or a positive voltage and a negative voltage, or two positive voltages, among other configurations. The base 360-c may also include a device memory controller 155-c (e.g., of a logic die), which may be an example of a device memory controller 155 described with reference to FIG. 1. The device memory controller 155-c may be coupled with at least each of the die circuitry 310-c-1 through 310-c-4 for controlling aspects of operations of the memory dies 200-c-1 through 200-c-4.

In the example of memory device 110-c, which illustrates a configurable power distribution arrangement, each of the memory dies 200-c may be constructed identically, but may be configured differently (e.g., based on a position of the memory die 200-c in the memory device 110-c). For example, to support identical memory dies 200-c, each of the memory dies 200-c may include a respective selection component 510 that is configured differently. In one example, the memory die 200-c-1 may be configured with a first switching component 515-a being in a closed-circuit configuration, and second through fourth switching components 515-a being in an open-circuit configuration, such that the die circuitry 310-c-1 is coupled with the contact 365-c-1 of the base 360-c and isolated from the other contacts 365-c of the base 360-c. Further, the memory die 200-c-2 may be configured with a second switching component 515-a being in a closed-circuit configuration, and first, third, and fourth switching components 515-a being in an open-circuit configuration, such that the die circuitry 310-c-2 is coupled with the contact 365-c-2 of the base 360-c and isolated from the other contacts 365-c of the base 360-c.

In some examples, a power distribution configuration of the memory device 110-c may be supported by switching components 515 including fuses or antifuses that are configured, before or after assembling a memory die 200-c in the memory device 110-c, based on a position of the respective memory die 200-c in the memory device 110-c. In some examples, each of the selection components 510-a may be coupled with the device memory controller 155-c, and the device memory controller 155-c may provide one or more logical signals to each of the selection components 510-a for configuring respective switching components 515-a. In various examples, the device memory controller 155-c may include a static configuration for such logic signals (e.g., based on static entries of a mode register associated with the device memory controller 155-c, based on fuses or antifuses of the device memory controller 155-c, based on a circuit configuration of the device memory controller 155-c), or the device memory controller 155-c may otherwise determine such logic signals (e.g., during a startup or initialization operation). In some examples, a device memory controller 155-c, or a manufacturing controller used in the assembly of the memory device 110-c, may evaluate various conductive paths of the memory dies 200-c or the base 360-c and configure selection components 510-a or switching components 515-a based on the evaluation, such as establishing favorable conductive paths among the components, or avoiding failed conductive paths or broken circuit elements (e.g., open circuit paths), among other considerations.

Although described and illustrated with reference to interconnection with one power source 180 for a single voltage level, and for a single conductor 340-b and a single die circuitry 310-c for each memory die 200-c, the conceptual arrangement of contacts 320-c-1 through 320-c-4, contacts 330-c-1 through 330-c-4, and selection components 510-c (e.g., a configurable power distribution arrangement), as applied in FIG. 5B, may be functionally repeated for one or more other voltage levels, for multiple connections with a single die circuitry 310 of a memory die 200, for connections with multiple die circuitry 310 of a memory die 200, or various combinations thereof (not illustrated). Moreover, in some examples of a memory device 110 or memory die 200, one or more described techniques for configurable power distribution may be used in combination with one or more described techniques for diagonal through-die arrangements or straight through-die arrangements.

Figure 6:
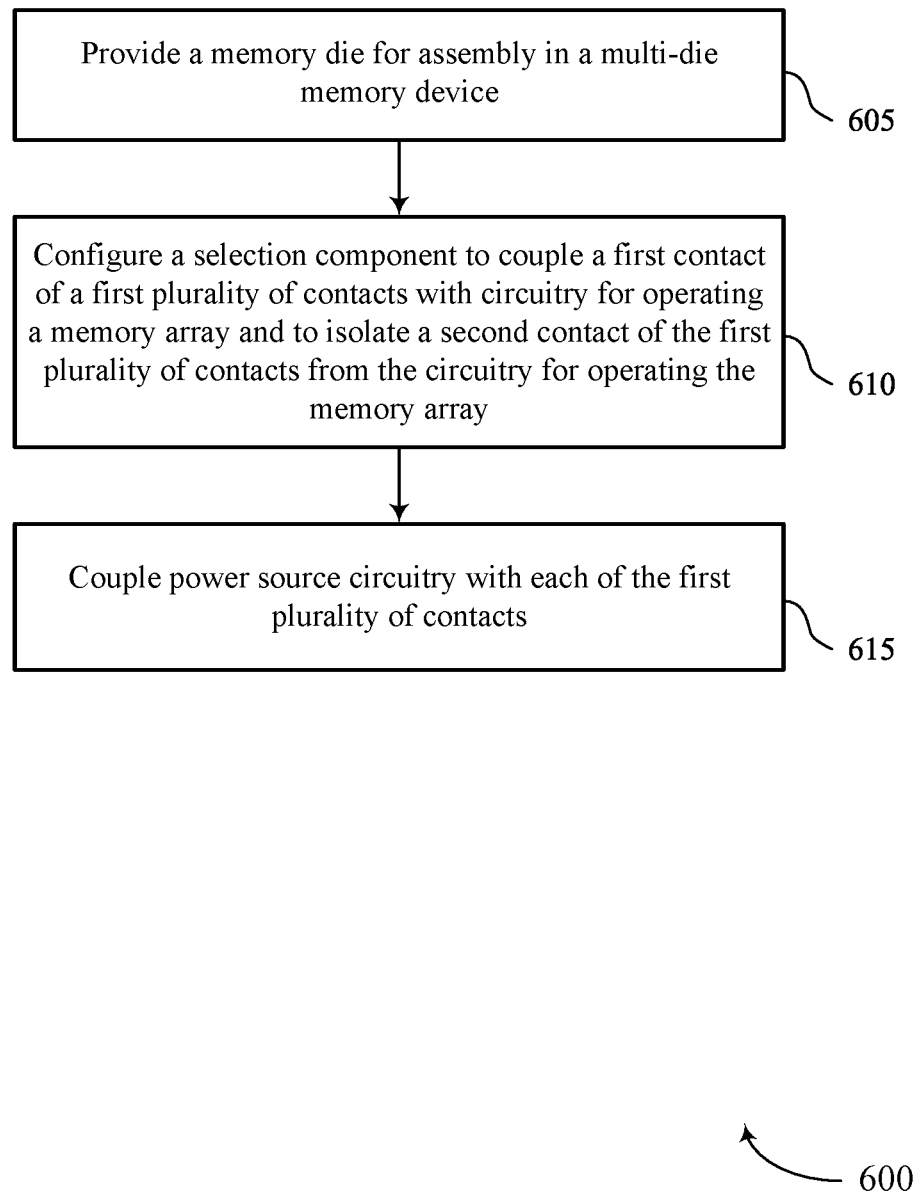
FIG. 6 shows a flowchart illustrating a method or methods that support power distribution for stacked memory in accordance with examples as disclosed herein.

FIG. 6 shows a flowchart illustrating a method that supports power distribution for stacked memory in accordance with examples as disclosed herein. In some examples, one or more operations of the method of FIG. 6 may be implemented by a manufacturing system or one or more controllers associated with a manufacturing system. Additionally or alternatively, one or more operations of the method of FIG. 6 may be performed by a component of a memory device 110 (e.g., a device memory controller 155, a local memory controller 165). In some examples, one or more controllers may execute a set of instructions to control the functional elements of the manufacturing system or memory device to perform the described functions. Additionally or alternatively, one or more controllers may perform aspects of the described functions using special-purpose hardware.

At 605, the method may include providing a memory die for assembly in a multi-die memory device. In some examples, the memory die may include a first plurality of contacts (e.g., on a first surface of the memory die) and a selection component coupled between each contact of the first plurality of contacts and circuitry for operating a memory array of the memory die. In some examples, the memory die may include a second plurality of contacts (e.g., on a second surface of the memory die) that are each coupled with a respective one of the first plurality of contacts. The operations of 605 may be performed in accordance with techniques as disclosed herein.

At 610, the method may include configuring a selection component (e.g., of the memory die) to couple a first contact of a first plurality of contacts with circuitry for operating a memory array and to isolate a second contact of the first plurality of contacts from the circuitry for operating the memory array. The operations of 610 may be performed in accordance with techniques as disclosed herein.

At 615, the method may include coupling power source circuitry with each of the first plurality of contacts. The operations of 615 may be performed in accordance with techniques as disclosed herein.

In some examples, an apparatus as described herein may perform a method or methods, such as the method or methods of FIG. 6. The apparatus may include, features, circuitry, logic, means, or instructions (e.g., a non-transitory computer-readable medium storing instructions executable by a processor) for providing a memory die for assembly in a multi-die memory device. In some examples, the memory die may include a first plurality of contacts (e.g., on a first surface of the memory die) and a selection component coupled between each contact of the first plurality of contacts and circuitry for operating a memory array of the memory die. In some examples, the memory die may include a second plurality of contacts (e.g., on a second surface of the memory die) that are each coupled with a respective one of the first plurality of contacts. The apparatus may further include, features, circuitry, logic, means, or instructions for configuring a selection component (e.g., of the memory die) to couple a first contact of a first plurality of contacts with circuitry for operating the memory array and to isolate a second contact of the first plurality of contacts from the circuitry for operating the memory array, and for coupling power source circuitry with each of the first plurality of contacts.

In some examples of the method of FIG. 6 and the apparatus described herein, coupling the power source circuitry with each of the first plurality of contacts may include or involve operations, features, circuitry, logic, means, or instructions for bonding the memory die to a substrate (e.g., a logic die) including the power source circuitry, where the bonding may include establishing an electrical connection between each contact of the first plurality of contacts with one or more contacts of the substrate that are coupled with the power source circuitry.

In some examples of the method of FIG. 6 and the apparatus described herein, coupling the power source circuitry with each of the first plurality of contacts may include or involve operations, features, circuitry, logic, means, or instructions for bonding the memory die to another memory die that includes one or more through-die conductors that are coupled or are otherwise configured for coupling, directly or indirectly, with a substrate including the power source circuitry, where the bonding may include establishing an electrical connection between each contact of the first plurality of contacts with one or more contacts of the other memory die that are coupled with the one or more through-die conductors. In some examples, memory cells of both of the memory die and the other memory die may be addressable over a same CA channel or CA bus (e.g., via a logic die).

In some examples of the method of FIG. 6 and the apparatus described herein, configuring the selection component may include or involve operations, features, circuitry, logic, means, or instructions that are operable based at least in part on a position of the memory die relative to a second memory die of the multi-die memory device. For example, a controller of a manufacturing operation, or a controller of a memory device (e.g., a device memory controller 155), or a controller of a memory die (e.g., a local memory controller 165) may identify a relative or absolute position of the memory die (e.g., in a stack or sequence of memory dies), and configure the selection component for the coupling or isolation based at least in part on the identified position.

In some examples of the method of FIG. 6 and the apparatus described herein, configuring the selection component may include or involve operations, features, circuitry, logic, means, or instructions for maintaining continuity of a first fuse between the first contact and the circuitry for operating the memory array and breaking continuity (e.g., in a manufacturing operation) of a second fuse between the second contact and the circuitry for operating the memory array.

In some examples of the method of FIG. 6 and the apparatus described herein, configuring the selection component may include or involve operations, features, circuitry, logic, means, or instructions for establishing continuity (e.g., in a manufacturing operation) of a first antifuse between the first contact and the circuitry for operating the memory array and maintaining isolation (e.g., electrical isolation) of a second antifuse between the second contact and the circuitry for operating the memory array.

In some examples of the method of FIG. 6 and the apparatus described herein, configuring the selection component may include or involve operations, features, circuitry, logic, means, or instructions for providing a first signal to establish continuity (e.g., electrical continuity) through a first switching component between the first contact and the circuitry for operating the memory array and providing a second signal to establish isolation (e.g., electrical isolation) through a second switching component between the second contact and the circuitry for operating the memory array. In some examples, the first signal, the second signal, or both may be configured to be provided to the memory die (e.g., to the selection component, to the first switching component, to the second switching component) by a device memory controller. In some examples, the first signal, the second signal, or both may be determined or otherwise configured to be provided based on a mode register setting (e.g., of the memory device, of the device memory controller), based on a fuse or antifuse setting (e.g., of the memory device, of the device memory controller), based on a circuit configuration (e.g., of the memory device, of the device memory controller), based on a setting determined during a startup, initialization, or other operation, or other settings or combinations thereof.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array of a first semiconductor die, the memory array including a plurality of memory cells, and a first interface (e.g., electrical interface, conductive interface, physical interface) couplable with a power source (e.g., external to the first semiconductor die, operable for supporting access operations on the plurality of memory cells). The apparatus may also include a second interface that is isolated (e.g., electrically isolated) from the first interface within the first semiconductor die and that is couplable with the power source. The apparatus may also include a third interface that is isolated (e.g., electrically isolated) from the first interface within the first semiconductor die and that is coupled (e.g., electrically coupled) with the second interface within the first semiconductor die. In some examples, the third interface may be couplable with a second semiconductor die or some other component external to the first semiconductor die. In some examples, the first semiconductor die may be couplable with a second semiconductor die in a stack of memory dies (e.g., including the first and second semiconductor dies), where the second semiconductor die includes a second plurality of memory cells. In some examples, the memory cells of the first and second semiconductor dies may be addressable via a same or common command/address bus (e.g., of or otherwise associated with a memory device that includes the first and second semiconductor dies).

In some examples of the apparatus, the coupling between the second interface and the third interface may be operable to provide power from the power source to the second semiconductor die (e.g., for supporting access operations on memory cells of the second semiconductor die) or other component external to the first semiconductor die.

In some examples of the apparatus, the first interface may be coincident with a first surface of the first semiconductor die and the third interface may be coincident with a second surface of the first semiconductor die (e.g., opposite the first surface of the first semiconductor die).

In some examples of the apparatus, the coupling between the second interface and the third interface may include a first conductor portion coupled with the second interface and extending perpendicular to the first surface (e.g., as at least a portion of a TSV), a second conductor portion coupled with the third interface and extending perpendicular to the second surface (e.g., as at least a portion of a power distribution layer, as an intra-layer conductor), and a third conductor portion coupled with the first conductor portion and with the second conductor portion and extending in a direction parallel to the first surface, the second surface, or both (e.g., as at least a portion of another TSV).

In some examples of the apparatus, when viewed along a direction from the first surface to the second surface, a cross-section of the first interface may at least partially overlap or may be otherwise coincident with a cross-section of the third interface.

In some examples of the apparatus, when viewed along a direction from the first surface to the second surface, a cross-section of the first interface may be non-overlapping or otherwise non-coincident with a cross-section of the third interface.

In some examples, the apparatus may include a fourth interface that is couplable with a ground voltage source (e.g., external to the first semiconductor die, for supporting access operations on the plurality of memory cells). The apparatus may further include a fifth interface that is isolated (e.g., electrically isolated) from the fourth interface within the first semiconductor die and couplable with the ground voltage source, and a sixth interface that is isolated (e.g., electrically isolated) from the fourth interface within the first semiconductor die, and coupled (e.g., electrically coupled) with the fifth interface within the first semiconductor die. The sixth interface may be couplable with the second semiconductor die or another component external to the first semiconductor die.

In some examples, the apparatus may include a fourth interface that is couplable with a ground voltage source (e.g., external to the first semiconductor die, for supporting access operations on the plurality of memory cells) and a fifth interface that is coupled with the fourth interface within the first semiconductor die. In some examples, the fifth interface may be couplable with the second semiconductor die or another component external to the first semiconductor die.

Another apparatus is described. The apparatus may include a memory array of a first memory die, the memory array including a plurality of memory cells. The apparatus may also include a first plurality of contacts (e.g., of or included in the memory die, on or coincident with a first surface of the first memory die) that are each couplable with a voltage source that is external to the first memory die, and a second plurality of contacts (e.g., of or included in the memory die, on or coincident with a second surface of the first memory die) that are each coupled (e.g., electrically coupled) with a respective one of the first plurality of contacts. In some examples, each of the second plurality of contacts may be couplable with a second memory die or another component external to the first memory die. The apparatus may also include a selection component (e.g., of or included in the memory die) operable to couple a first contact of the first plurality of contacts with circuitry of the first memory die (e.g., for operating the memory array using the voltage source) and to isolate a second contact of the first plurality of contacts from the circuitry.

In some examples of the apparatus, each contact of the first plurality of contacts may be isolated (e.g., electrically isolated) from the other contacts of the first plurality of contacts within the first memory die.

In some examples of the apparatus, the respective one of the second plurality of contacts that is coupled with the second contact of the first plurality of contacts may be operable to couple the voltage source with the second memory die (e.g., for operating a second memory array of the second memory die using the voltage source) or the other component external to the first memory die.

In some examples of the apparatus, the selection component may include a respective fuse that is coupled between the circuitry for operating the memory array and each contact of the first plurality of contacts.

In some examples of the apparatus, the selection component may include a respective antifuse that is coupled between the circuitry for operating the memory array and each contact of the first plurality of contacts.

In some examples of the apparatus, the selection component may include a respective switching component coupled between the circuitry for operating the memory array and each contact of the first plurality of contacts. In some examples, the respective switching components may be operable (e.g., for coupling or isolating) based at least in part on a logical signal (e.g., received from a host device, received from a device memory controller, received from a local memory controller, received from a logic die).

Another apparatus is described. The apparatus may include a voltage source (e.g., of or otherwise associated with a memory device), which may include a conductor or component of the memory device that is operable to receive a voltage or power from outside the memory device (e.g., from a host device, from an external power supply), and is operable to provide a voltage or power to memory dies of the memory device. In some example, the voltage source may include or refer to a regulated voltage supply that is common to the memory dies of the memory device, and the voltage source may be external to each of the memory dies of the memory device (e.g., in a logic die of the memory device). The apparatus may also include a first memory die (e.g., of the memory device, of a stack of memory dies). The first memory die may include a first memory array including a first plurality of memory cells, and a first interface coupled with the voltage source and coupled with circuitry for operating the first memory array. The first memory die may also include a second interface that is isolated (e.g., electrically isolated) from the first interface within the first memory die and that is coupled (e.g., electrically coupled) with the voltage source, and a third interface that is isolated (e.g., electrically isolated) from the first interface and is coupled with the second interface within the first memory die. The apparatus may also include a second memory die (e.g., of the memory device, of the stack of memory dies). The second memory die may include a second memory array including a second plurality of memory cells and a fourth interface coupled with the third interface (e.g., of the first memory die) and coupled with circuitry for operating the second memory array.

In some examples, the first memory array and the second memory array, or the first plurality of memory cells and the second plurality of memory cells, may be addressable via a same command/address bus or channel of the memory device.

In some examples, the apparatus may include a bonding layer between the first memory die and the second memory die. The bonding layer may include a conductive material in contact with (e.g., physically coupling, electrically coupling) the third interface and the fourth interface.

In some examples of the apparatus, when viewed along a direction perpendicular to a plane between the first memory die and the second memory die, a cross-section of the first interface may at least partially overlap or be otherwise coincident with a cross-section of the third interface.

In some examples of the apparatus, when viewed along a direction perpendicular to a plane between the first memory die and the second memory die, a cross-section of the first interface may be non-overlapping or be otherwise non-coincident with a cross-section of the third interface.

In some examples, the apparatus may include a second voltage source (e.g., of the memory device). In some such examples, the first memory die may further include a fifth interface that is coupled (e.g., electrically coupled) with the second voltage source and is coupled with the circuitry for operating the first memory array. The first memory die may further include a sixth interface that is isolated (e.g., electrically isolated) from the fifth interface within the first memory die and that is coupled (e.g., electrically coupled) with the second voltage source, and a seventh interface that is isolated (e.g., electrically isolated) from the fifth interface within the first memory die and that is coupled (e.g., electrically coupled) with the sixth interface within the first memory die. Moreover, in some such examples, the second memory die may further include an eighth interface that is coupled with the seventh interface (e.g., of the first memory die) and that is coupled with the circuitry for operating the second memory array In some examples, the apparatus may include a second voltage source (e.g., of the memory device). In some such examples, the first memory die may further include a fifth interface that is coupled (e.g., electrically coupled) with the second voltage source and is that coupled (e.g., electrically coupled) with the circuitry for operating the first memory array, and a sixth interface that is coupled with the fifth interface within the first memory die. Moreover, in some such examples, the second memory die may further include a seventh interface that is coupled with the sixth interface and that is coupled with the circuitry for operating the second memory array.

Another apparatus is described. The apparatus may include a power source (e.g., of or otherwise associated with a memory device, of a logic die), which may include a conductor or component of the memory device that is operable to receive a voltage or power from outside the memory device (e.g., from a host device, from an external power supply), and is operable to provide a voltage or power to memory dies of the memory device. In some examples, the power source may include or refer to a regulated voltage supply that is common to the memory dies of the memory device, and the power source may be external to each of the memory dies of the memory device. The apparatus may also include a first memory die (e.g., of the memory device, of a stack of memory dies). The first memory die may include a first memory array including a first plurality of memory cells, and a first plurality of contacts (e.g., on a first surface of the first memory die) that are each coupled with the power source. The first memory die may also include a second plurality of contacts (e.g., on a second surface of the first memory die) that are coupled with a respective one of the first plurality of contacts. The first memory die may also include a first switching component configured or otherwise configurable to couple one of the first plurality of contacts with circuitry for operating the first memory array, and a second switching component configured or otherwise configurable to isolate one of the second plurality of contacts from the circuitry for operating the first memory array. The apparatus may also include a second memory die (e.g., of the memory device, of the stack of memory dies). The second memory die may include a second memory array including a second plurality of memory cells, and a third plurality of contacts (e.g., on a first surface of the second memory die) each coupled with a respective one of the second plurality of contacts (e.g., of the first memory die). The second memory die may also include a third switching component configured or otherwise configurable to couple the one of the third plurality of contacts that is coupled with the one of the second plurality of contacts with circuitry for operating the second memory array.

In some examples, the first memory array and the second memory array, or the first plurality of memory cells and the second plurality of memory cells, may be addressable via a same command/address bus or channel of the memory device.

In some examples of the apparatus, the power source may include a voltage regulator that is separate from the first memory die and the second memory die and that is configured to provide power to the first memory die and to the second memory die at a regulated voltage.

In some examples of the apparatus, each contact of the first plurality of contacts may be isolated (e.g., electrically isolated) from the other contacts of the first plurality of contacts within the first memory die and each contact of the third plurality of contacts may be isolated (e.g., electrically isolated) from the other contacts of the third plurality of contacts within the second memory die.

In some examples of the apparatus, the first switching component may include a one-time programmable switch configured in or otherwise configurable for a closed-circuit configuration, the second switching component may include a second one-time programmable switch configured in or otherwise configurable for an open-circuit configuration, and the third switching component may include a third one-time programmable switch configured in or otherwise configurable for a closed-circuit configuration.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated (e.g., electrically isolated) from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array of a first semiconductor die, the memory array comprising a plurality of memory cells;
   a first interface couplable with a power source external to the first semiconductor die, wherein the first interface is coincident with a first surface of the first semiconductor die;
   a second interface that is electrically isolated from the first interface within the first semiconductor die and is couplable with the power source; and
   a third interface that is electrically isolated from the first interface within the first semiconductor die, coupled with the second interface within the first semiconductor die, and couplable with a second semiconductor die in a stack of memory dies that comprises the first and second semiconductor dies, the second semiconductor die comprising a second plurality of memory cells addressable via a same command/address bus as the first semiconductor die, wherein the third interface is coincident with a second surface of the first semiconductor die opposite the first surface of the first semiconductor die,
   wherein the coupling between the second interface and the third interface comprises:
      a first conductor portion coupled with the second interface and extending perpendicular to the first surface;
      a second conductor portion coupled with the third interface and extending perpendicular to the second surface; and
      a third conductor portion coupled with the first conductor portion and with the second conductor portion and extending in a direction parallel to the first surface, the second surface, or both.

2. The apparatus of claim 1, wherein the coupling between the second interface and the third interface is operable to provide power from the power source to the second semiconductor die for supporting access operations on the second plurality of memory cells.

3. An apparatus, comprising:
   a memory array of a first semiconductor die, the memory array comprising a plurality of memory cells;
   a first interface couplable with a power source external to the first semiconductor die, wherein the first interface is coincident with a first surface of the first semiconductor die;
   a second interface that is electrically isolated from the first interface within the first semiconductor die and is couplable with the power source; and
   a third interface that is electrically isolated from the first interface within the first semiconductor die, coupled with the second interface within the first semiconductor die, and couplable with a second semiconductor die in a stack of memory dies that comprises the first and second semiconductor dies, the second semiconductor die comprising a second plurality of memory cells addressable via a same command/address bus as the first semiconductor die, wherein the third interface is coincident with a second surface of the first semiconductor die opposite the first surface of the first semiconductor die,
   wherein, when viewed along a direction from the first surface to the second surface, a cross-section of the first interface at least partially overlaps with a cross-section of the third interface.

4. An apparatus, comprising:
   a memory array of a first semiconductor die, the memory array comprising a plurality of memory cells;
   a first interface couplable with a power source external to the first semiconductor die, wherein the first interface is coincident with a first surface of the first semiconductor die;
   a second interface that is electrically isolated from the first interface within the first semiconductor die and is couplable with the power source; and
   a third interface that is electrically isolated from the first interface within the first semiconductor die, coupled with the second interface within the first semiconductor die, and couplable with a second semiconductor die in a stack of memory dies that comprises the first and second semiconductor dies, the second semiconductor die comprising a second plurality of memory cells addressable via a same command/address bus as the first semiconductor die, wherein the third interface is coincident with a second surface of the first semiconductor die opposite the first surface of the first semiconductor die, wherein, when viewed along a direction from the first surface to the second surface, a cross-section of the first interface is non-overlapping with a cross-section of the third interface.

5. An apparatus, comprising:
a memory array of a first semiconductor die, the memory array comprising a plurality of memory cells;
a first interface couplable with a power source external to the first semiconductor die;
a second interface that is electrically isolated from the first interface within the first semiconductor die and is couplable with the power source;
a third interface that is electrically isolated from the first interface within the first semiconductor die, coupled with the second interface within the first semiconductor die, and couplable with a second semiconductor die in a stack of memory dies that comprises the first and second semiconductor dies, the second semiconductor die comprising a second plurality of memory cells addressable via a same command/address bus as the first semiconductor die;
a fourth interface couplable with a ground voltage source that is external to the first semiconductor die;
a fifth interface that is electrically isolated from the fourth interface within the first semiconductor die and is couplable with the ground voltage source; and
a sixth interface that is electrically isolated from the fourth interface within the first semiconductor die, coupled with the fifth interface within the first semiconductor die, and couplable with the second semiconductor die.

6. An apparatus, comprising:
a memory array of a first semiconductor die, the memory array comprising a plurality of memory cells;
a first interface couplable with a power source external to the first semiconductor die;
a second interface that is electrically isolated from the first interface within the first semiconductor die and is couplable with the power source;
a third interface that is electrically isolated from the first interface within the first semiconductor die, coupled with the second interface within the first semiconductor die, and couplable with a second semiconductor die in a stack of memory dies that comprises the first and second semiconductor dies, the second semiconductor die comprising a second plurality of memory cells addressable via a same command/address bus as the first semiconductor die;
a fourth interface is couplable with a ground voltage source that is external to the first semiconductor die; and
a fifth interface that is coupled with the fourth interface within the first semiconductor die and is couplable with the second semiconductor die.

7. An apparatus, comprising:
a voltage source of a memory device;
a first memory die of the memory device, the first memory die comprising:
a first memory array comprising a first plurality of memory cells;
a first interface coupled with the voltage source and coupled with circuitry for operating the first memory array;
a second interface that is electrically isolated from the first interface within the first memory die and is coupled with the voltage source; and
a third interface that is electrically isolated from the first interface and is coupled with the second interface within the first memory die; and
a second memory die of the memory device, the second memory die comprising:
a second memory array comprising a second plurality of memory cells; and
a fourth interface coupled with the third interface and coupled with circuitry for operating the second memory array,
wherein, when viewed along a direction perpendicular to a plane between the first memory die and the second memory die, a cross-section of the first interface at least partially overlaps with a cross-section of the third interface.

8. The apparatus of claim 7, further comprising:
a bonding layer between the first memory die and the second memory die, the bonding layer comprising a conductive material in contact with the third interface and the fourth interface.

9. An apparatus, comprising:
a voltage source of a memory device;
a first memory die of the memory device, the first memory die comprising:
a first memory array comprising a first plurality of memory cells;
a first interface coupled with the voltage source and coupled with circuitry for operating the first memory array;
a second interface that is electrically isolated from the first interface within the first memory die and is coupled with the voltage source; and
a third interface that is electrically isolated from the first interface and is coupled with the second interface within the first memory die; and
a second memory die of the memory device, the second memory die comprising:
a second memory array comprising a second plurality of memory cells; and
a fourth interface coupled with the third interface and coupled with circuitry for operating the second memory array,
wherein, when viewed along a direction perpendicular to a plane between the first memory die and the second memory die, a cross-section of the first interface is non-overlapping with a cross-section of the third interface.

10. An apparatus, comprising:
a voltage source of a memory device;
a second voltage source of the memory device;
a first memory die of the memory device, the first memory die comprising:
a first memory array comprising a first plurality of memory cells;
a first interface coupled with the voltage source and coupled with circuitry for operating the first memory array;
a second interface that is electrically isolated from the first interface within the first memory die and is coupled with the voltage source;
a third interface that is electrically isolated from the first interface and is coupled with the second interface within the first memory die;

a fifth interface that is coupled with the second voltage source and is coupled with the circuitry for operating the first memory array;

a sixth interface that is electrically isolated from the fifth interface within the first memory die and is coupled with the second voltage source; and a seventh interface that is electrically isolated from the fifth interface within the first memory die and coupled with the sixth interface within the first memory die; and a second memory die of the memory device, the second memory die comprising:

a second memory array comprising a second plurality of memory cells;

a fourth interface coupled with the third interface and coupled with circuitry for operating the second memory array; and an eighth interface coupled with the seventh interface and coupled with the circuitry for operating the second memory array.

11. An apparatus, comprising:

a voltage source of a memory device;

a second voltage source of the memory device;

a first memory die of the memory device, the first memory die comprising:

a first memory array comprising a first plurality of memory cells;

a first interface coupled with the voltage source and coupled with circuitry for operating the first memory array;

a second interface that is electrically isolated from the first interface within the first memory die and is coupled with the voltage source;

a third interface that is electrically isolated from the first interface and is coupled with the second interface within the first memory die;

a fifth interface that is coupled with the second voltage source and is coupled with the circuitry for operating the first memory array; and a sixth interface that is coupled with the fifth interface within the first memory die; and a second memory die of the memory device, the second memory die comprising:

a second memory array comprising a second plurality of memory cells;

a fourth interface coupled with the third interface and coupled with circuitry for operating the second memory array; and a seventh interface coupled with the sixth interface and coupled with the circuitry for operating the second memory array.

12. An apparatus, comprising:

a power source of a memory device;

a first memory die of the memory device, the first memory die comprising:

a first memory array comprising a first plurality of memory cells;

a first plurality of contacts on a first surface of the first memory die that are each coupled with the power source;

a second plurality of contacts on a second surface of the first memory die and coupled with a respective one of the first plurality of contacts;

a first switching component configured to couple one of the first plurality of contacts with circuitry for operating the first memory array, wherein the first switching component comprises a one-time programmable switch configured in a closed-circuit configuration; and a second switching component configured to isolate one of the second plurality of contacts from the circuitry for operating the first memory array, wherein the second switching component comprises a second one-time programmable switch configured in an open-circuit configuration; and a second memory die of the memory device, the second memory die comprising:

a second memory array comprising a second plurality of memory cells;

a third plurality of contacts on a first surface of the second memory die each coupled with a respective one of the second plurality of contacts of the first memory die; and a third switching component configured to couple the one of the third plurality of contacts coupled with the one of the second plurality of contacts with circuitry for operating the second memory array, wherein the third switching component comprises a third one-time programmable switch configured in a closed-circuit configuration.

13. The apparatus of claim 12, wherein the power source comprises:

a voltage regulator separate from the first memory die and the second memory die and configured to provide power to the first memory die and to the second memory die at a regulated voltage.

14. The apparatus of claim 12, wherein:

each contact of the first plurality of contacts is electrically isolated from the other contacts of the first plurality of contacts within the first memory die; and each contact of the third plurality of contacts is electrically isolated from the other contacts of the third plurality of contacts within the second memory die.

15. A method, comprising:

providing a memory die for assembly in a multi-die memory device, the memory die comprising:

a first plurality of contacts on a first surface of the memory die;

a second plurality of contacts on a second surface of the memory die that are each coupled with a respective one of the first plurality of contacts; and a selection component coupled between each contact of the first plurality of contacts and circuitry for operating a memory array of the memory die;

configuring the selection component to couple a first contact of the first plurality of contacts with the circuitry for operating the memory array and to isolate a second contact of the first plurality of contacts from the circuitry for operating the memory array, wherein configuring the selection component is based at least in part on a position of the memory die relative to a second memory die of the multi-die memory device; and coupling power source circuitry with each of the first plurality of contacts on the first surface of the memory die.

16. The method of claim 15, wherein the coupling comprises:

bonding the memory die to a substrate comprising the power source circuitry, wherein the bonding comprises establishing an electrical connection between each contact of the first plurality of contacts with one or more contacts of the substrate that are coupled with the power source circuitry.

17. The method of claim 15, wherein configuring the selection component comprises:
maintaining continuity of a first fuse between the first contact and the circuitry for operating the memory array; and
breaking continuity of a second fuse between the second contact and the circuitry for operating the memory array.

18. The method of claim 15, wherein configuring the selection component comprises:
establishing continuity of a first antifuse between the first contact and the circuitry for operating the memory array; and
maintaining isolation of a second antifuse between the second contact and the circuitry for operating the memory array.

19. The method of claim 15, wherein configuring the selection component comprises:
providing a first signal to establish continuity through a first switching component between the first contact and the circuitry for operating the memory array; and
providing a second signal to establish isolation through a second switching component between the second contact and the circuitry for operating the memory array.

* * * * *